(12) United States Patent
Oda et al.

(10) Patent No.: US 7,090,413 B2
(45) Date of Patent: Aug. 15, 2006

(54) OPTICAL SEMICONDUCTOR DEVICE

(75) Inventors: Takuya Oda, Nagano (JP); Toshihisa Yoda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/111,347

(22) Filed: Apr. 21, 2005

(65) Prior Publication Data

US 2005/0238296 A1    Oct. 27, 2005

(30) Foreign Application Priority Data

Apr. 22, 2004  (JP) .............................. 2004-126746

(51) Int. Cl.
*G02B 6/36* (2006.01)

(52) U.S. Cl. .............................. 385/93; 385/92; 385/33
(58) Field of Classification Search .................... None
See application file for complete search history.

(56) References Cited

U.S. PATENT DOCUMENTS

2005/0196110 A1 * 9/2005 Aronson ...................... 385/92

FOREIGN PATENT DOCUMENTS

JP            02-065190         3/1990

* cited by examiner

*Primary Examiner*—Sung Pak
(74) *Attorney, Agent, or Firm*—Ladas & Parry LLP

(57) ABSTRACT

An optical semiconductor device is disclosed that includes an optical element mounted on a substrate and a window lid sealing the optical element in a space on the substrate. The window lid includes a frame member and a glass plate member. The frame member, formed by performing drawing on a metal plate, includes a top plate part having an opening window, a peripheral side plate part connected to the peripheral edge of the top plate part so as to surround a space thereon, and a flange part extending outward from the peripheral edge of the peripheral side plate part on the side opposite from the top plate part. The glass plate member, contained in the space formed by the top plate part and the peripheral side plate part, is welded to the substrate-side surface of the top plate part and the internal surface of the peripheral side plate part.

4 Claims, 6 Drawing Sheets

FIG.2A PRIOR ART
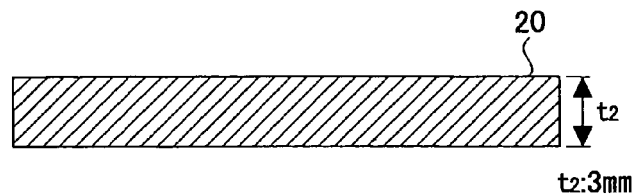
⇩ PRIMARY WINDOW OPENING
FIG.2B PRIOR ART
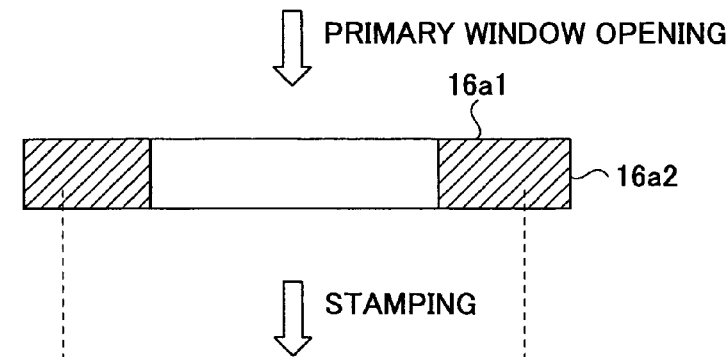
⇩ STAMPING
FIG.2C PRIOR ART
⇩ SECONDARY WINDOW OPENING (SIZING)
FIG.2D PRIOR ART
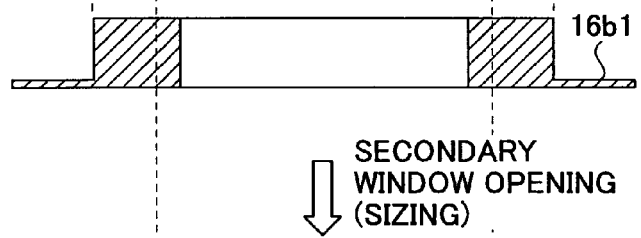
⇩ TRIMMING OF FLANGE PART
FIG.2E PRIOR ART
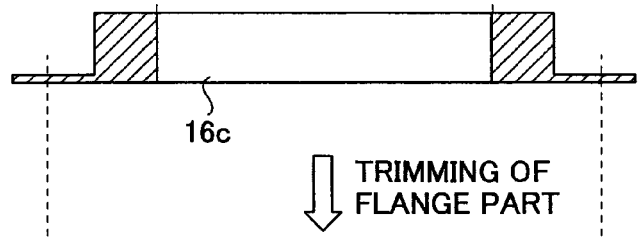
⇩ GRINDING
FIG.2F PRIOR ART
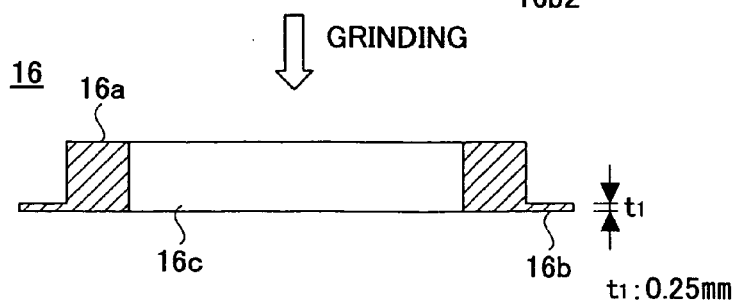
$t_2$: 3mm
$t_1$: 0.25mm

⇩ DRAWING

⇩ PRIMARY WINDOW OPENING

⇩ STAMPING

⇩ SECONDARY WINDOW OPENING (SIZING)

⇩ TRIMMING OF FLANGE PART

OPTICAL SEMICONDUCTOR DEVICE

BACKGROUND OF THE INVENTION

1. Field of the Invention

The present invention generally relates to optical semiconductor devices with a window lid, and more particularly to a semiconductor-type projection device.

2. Description of the Related Art

FIGS. 1A and 1B are diagrams illustrating a conventional semiconductor-type projection device 10. According to the semiconductor-type projection device 10, a DMD (digital micromirror device) main body 12 is mounted in a recess 11a on the upper surface of a ceramic substrate 11. A window lid 13 is fixed on the substrate 11 so as to close the recess 11a so that an internal space 14 is hermetically sealed. A window part 15 through which light passes is formed in the window lid 13.

A metal layer 11b is formed around the recess 11a on the upper surface of the substrate 11. The window lid 13 includes a Kovar frame member 16 and a glass plate member 17. As illustrated in FIG. 2F, the frame member 16 includes a frame part 16a and a flange part 16b extending outward therefrom with an opening window 16c formed inside the frame part 16a. The glass plate member 17 is fitted into the opening window 16c inside the frame member 16a. The peripheral surface of the glass plate member 17 is welded to the internal surface of the frame part 16a by matched welding so as to ensure air tightness therebetween. Further, the flange part 16b is seam-welded to the metal layer 11b of the substrate 11 so as to also ensure air tightness. The thickness $t_1$ of the flange part 16b is as thin as 0.25 mm so as to ensure excellent seam welding. As a result, a matched welding part 18 is formed between the peripheral surface of the glass plate member 17 and the internal surface of the frame part 16a, and a seam welding part 19 is formed between the flange part 16b and the metal layer 11b of the substrate 11. Japanese Laid-Open Patent Application No. 2-65190 discloses such a configuration.

Matched welding, which is accompanied by chemical reaction, may generate fine air bubbles or cracks in the glass plate member 17. The fine air bubbles or cracks appear in the window part 15 although in its periphery. Accordingly, light passing through the periphery of the window part 15 is affected by the air bubbles or cracks so as to reflect diffusely. This may affect the characteristics of the semiconductor-type projection device 10. This adverse effect is likely to be produced in particular when the window part 15 cannot be formed to be large in size. Further, the fine air bubbles or cracks exist in a part visible from above the semiconductor-type projection device 10. This impairs the appearance. In the case of viewing mass-produced semiconductor-type projection devices 10 from above, the rate of appearance of fine air bubbles in the window part 15 is 8%, and the rate of appearance of fine cracks in the window part 15 is 4%, which are relatively high.

The length of a seal pass L1 (FIG. 1A) by the matched welding part 18 is obtained by the thickness of the frame part 16a. However, it is difficult to make the thickness of the frame part 16a greater than a predetermined value. As a result, the seal pass L1 is limited to approximately 3 mm, and cannot be longer.

FIGS. 2A through 2F are diagrams for illustrating a process for manufacturing the frame member 16. As illustrated in FIG. 2A, the frame member 16 employs a thick plate material 20 of a thickness $t_2$ of approximately 3 mm as its material. Primary window opening is accomplished by performing blanking on the thick plate material 20 by press working as illustrated in FIG. 2B. Then, as illustrated in FIG. 2C, a peripheral part 16a2 of an initial frame part 16a1 is pressed by stamping so that an initial flange part 16b1 is formed. Further, as illustrated in FIG. 2D, secondary window opening is accomplished by press working so that the opening window 16c is formed. Then, as illustrated in FIG. 2E, the peripheral part of the initial flange part 16b1 is trimmed, and finally, as illustrated in FIG. 2F, the upper and lower surfaces of the trimmed flange part 16b2 are ground so that the trimmed flange part 16b2 has the thickness t1. Thereby, the frame member 16 is manufactured.

The thickness $t_2$ of the plate material 20, which is the material of the frame member 16, is more than ten times the thickness $t_1$ of the flange part 16b.

Accordingly, the plate material 20 must be pressed greatly in size, so that a large-size stamping machine is required. Further, it is difficult to obtain a predetermined size only by stamping, so that grinding is performed after stamping. This increases the manufacturing cost of the frame member 16.

SUMMARY OF THE INVENTION

Accordingly, it is a general object of the present invention to provide an optical semiconductor device in which the above-described disadvantages are eliminated.

A more specific object of the present invention is to provide an optical semiconductor device that is free of the adverse effect of air bubbles and cracks and can be manufactured at lower cost than conventionally.

The above objects of the present invention are achieved by an optical semiconductor device including: an optical element mounted on a substrate; and a window lid configured to seal the optical element in a space on the substrate, the window lid including a frame member and a glass plate member, the frame member being formed by performing drawing on a metal plate, wherein the frame member includes a top plate part having an opening window, a peripheral side plate part connected to a peripheral edge of the top plate part so as to surround a space on the top plate part, and a flange part extending outward from a peripheral edge of the peripheral side plate part on a side opposite from the top plate part, the flange part being fixed to the substrate, and the glass plate member is contained in the space formed by the top plate part and the peripheral side plate part of the frame member, the glass plate member being welded by matched welding to a surface of the top plate part on a side toward the substrate and an internal surface of the peripheral side plate part.

According to the present invention, a matched welding part is positioned outside an opening window, and is hidden under the top plate part of a frame member. Accordingly, even when air bubbles or cracks are generated in the matched welding part, the air bubbles or cracks are prevented from appearing in the opening window. Accordingly, the air bubbles or cracks do not have an adverse effect on the optical characteristics of an optical semiconductor device. Accordingly, an optical semiconductor device free of the effect of air bubbles or cracks can be realized. Further, the appearance of the optical semiconductor device is not impaired.

Further, the frame member is formed by performing drawing on a metal plate having a thickness corresponding to that of the top plate part. Accordingly, a window lid is lower in manufacturing cost than conventionally, so that the optical semiconductor device, which is an end product, is lower in manufacturing cost than conventionally.

BRIEF DESCRIPTION OF THE DRAWINGS

Other objects, features and advantages of the present invention will become more apparent from the following detailed description when read in conjunction with the accompanying drawings, in which:

FIGS. 2A through 2F are diagrams for illustrating a process for manufacturing a frame member of the conventional semiconductor-type projection device;

DETAILED DESCRIPTION OF THE PREFERRED EMBODIMENTS

A description is given below, with reference to the accompanying drawings, of an embodiment of the present invention.

Figure 1A:
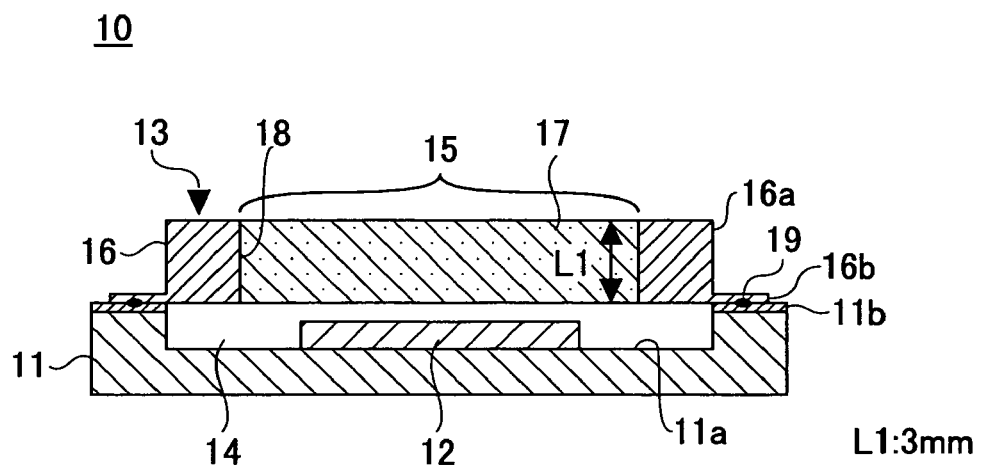
FIGS. 1A and 1B are a cross-sectional view and a plan view, respectively, of a conventional semiconductor-type projection device.
Figure 1B:
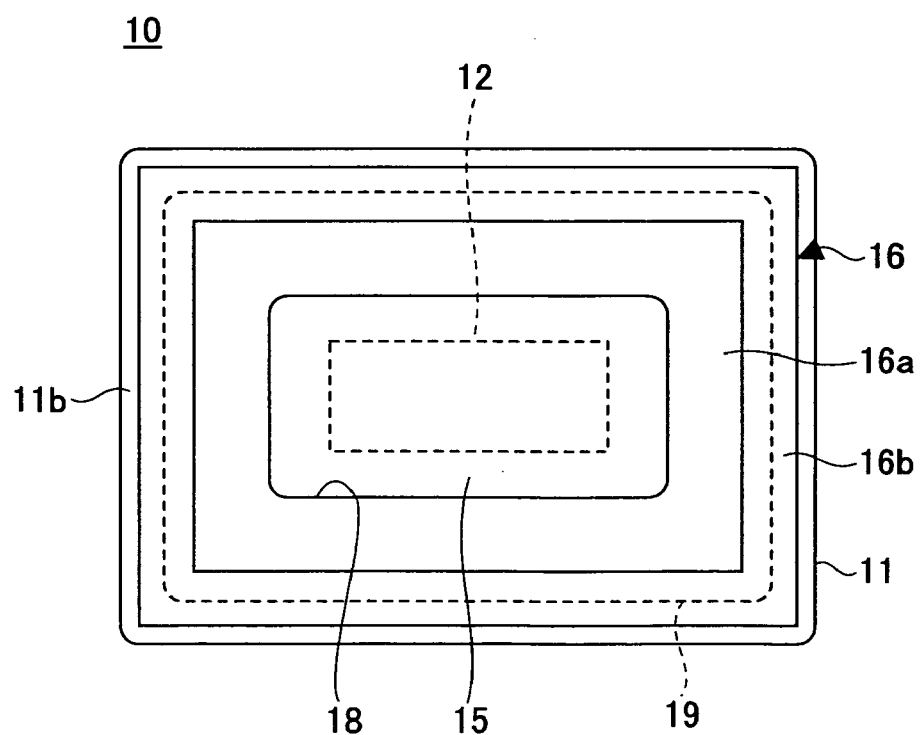
Figure 3:
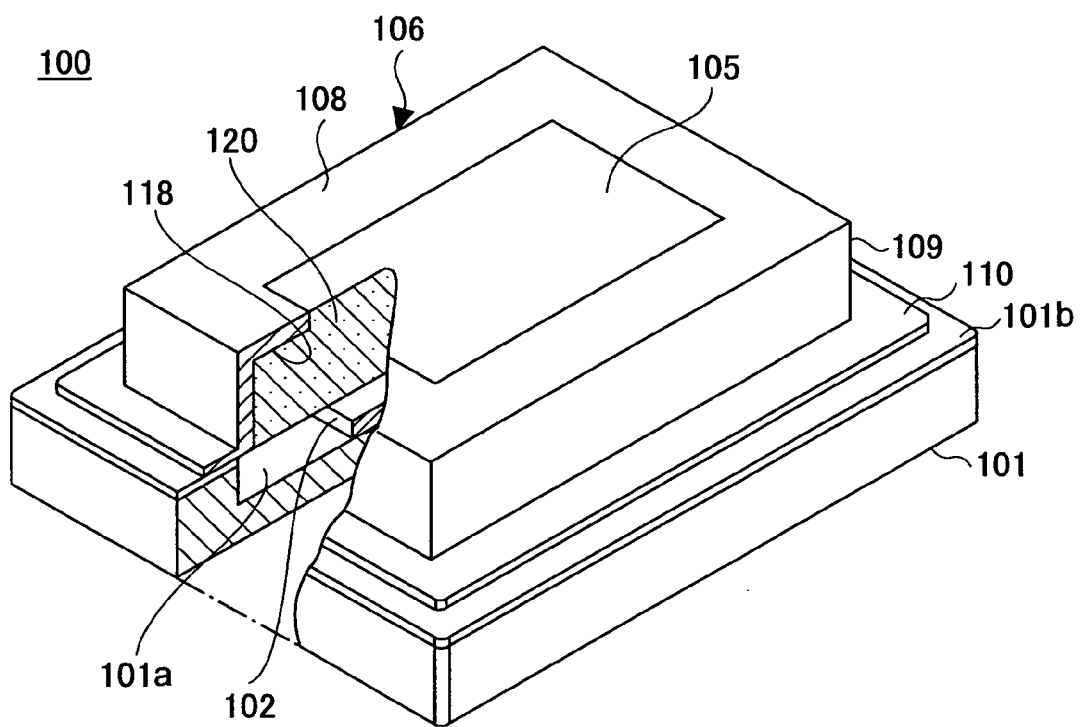
FIG. 3 is a partially sectioned perspective view of a semiconductor-type projection device according to an embodiment of the present invention.
Figure 4A:
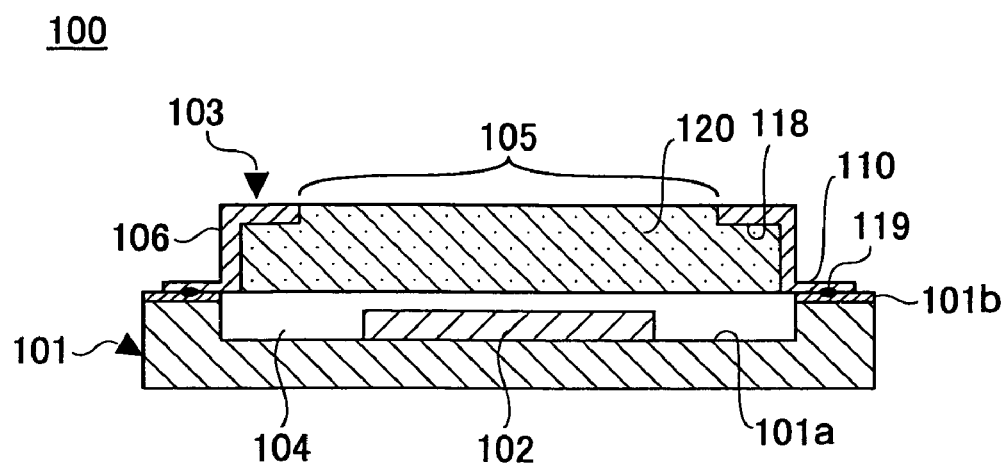
FIGS. 4A and 4B are a cross-sectional view and a plan view, respectively, of the semiconductor-type projection device according to the embodiment of the present invention.
Figure 4B:
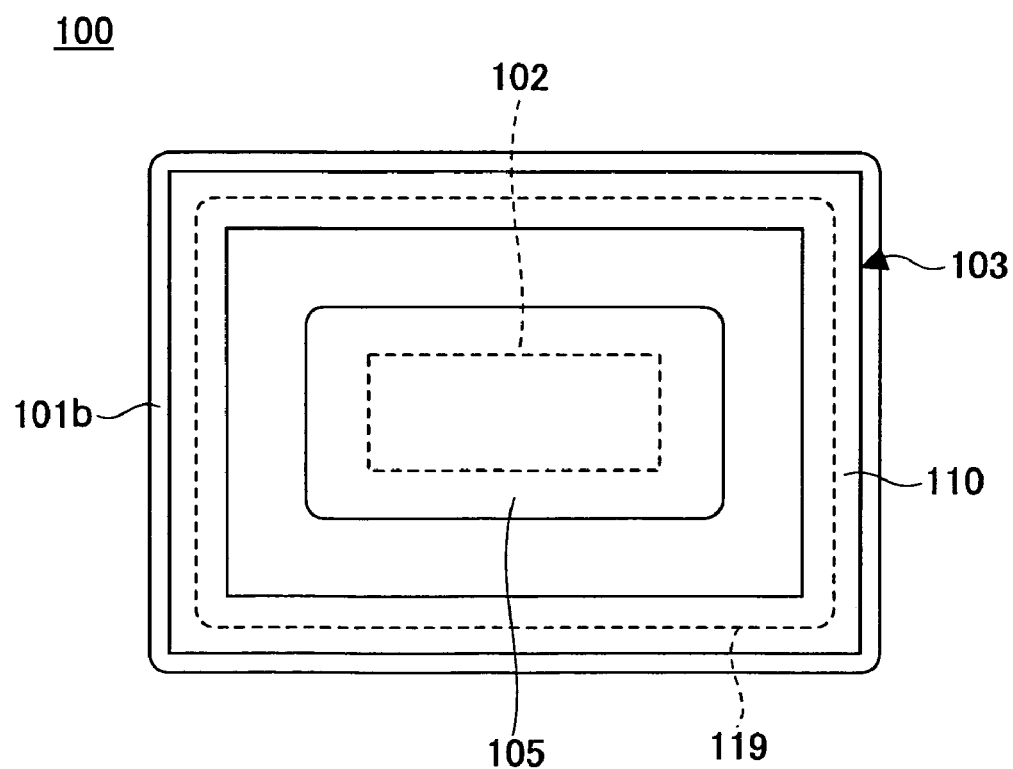

FIGS. 3, 4A, and 4B are diagrams illustrating a semiconductor-type projection device 100 according to the embodiment of the present invention. The semiconductor-type projection device 100 is configured differently in the window lid from the conventional semiconductor-type projection device 10 illustrated in FIGS. 1A and 1B. The semiconductor-type projection device 100 includes a ceramic substrate 101, a DMD main body 102, which is an optical element, and a window lid 103. The DMD main body 102 is mounted in a recess 101a on the upper surface of the substrate 101. The window lid 103 is fixed on the substrate 101 by seam welding so as to close the recess 101a so that an internal space 104 is hermetically sealed. A window part 105 through which light passes is formed in the window lid 103. The DMD main body 102 is laid with hundreds of thousands of extremely small mirrors so that each mirror is driven to be inclined. A metal layer 101b is formed on the upper surface of the substrate 101 around the recess 101a. A seam welding part 119 is formed between a below-described flange part 110 and the metal layer 101b on the entire periphery of the window lid 103.

Figure 5:
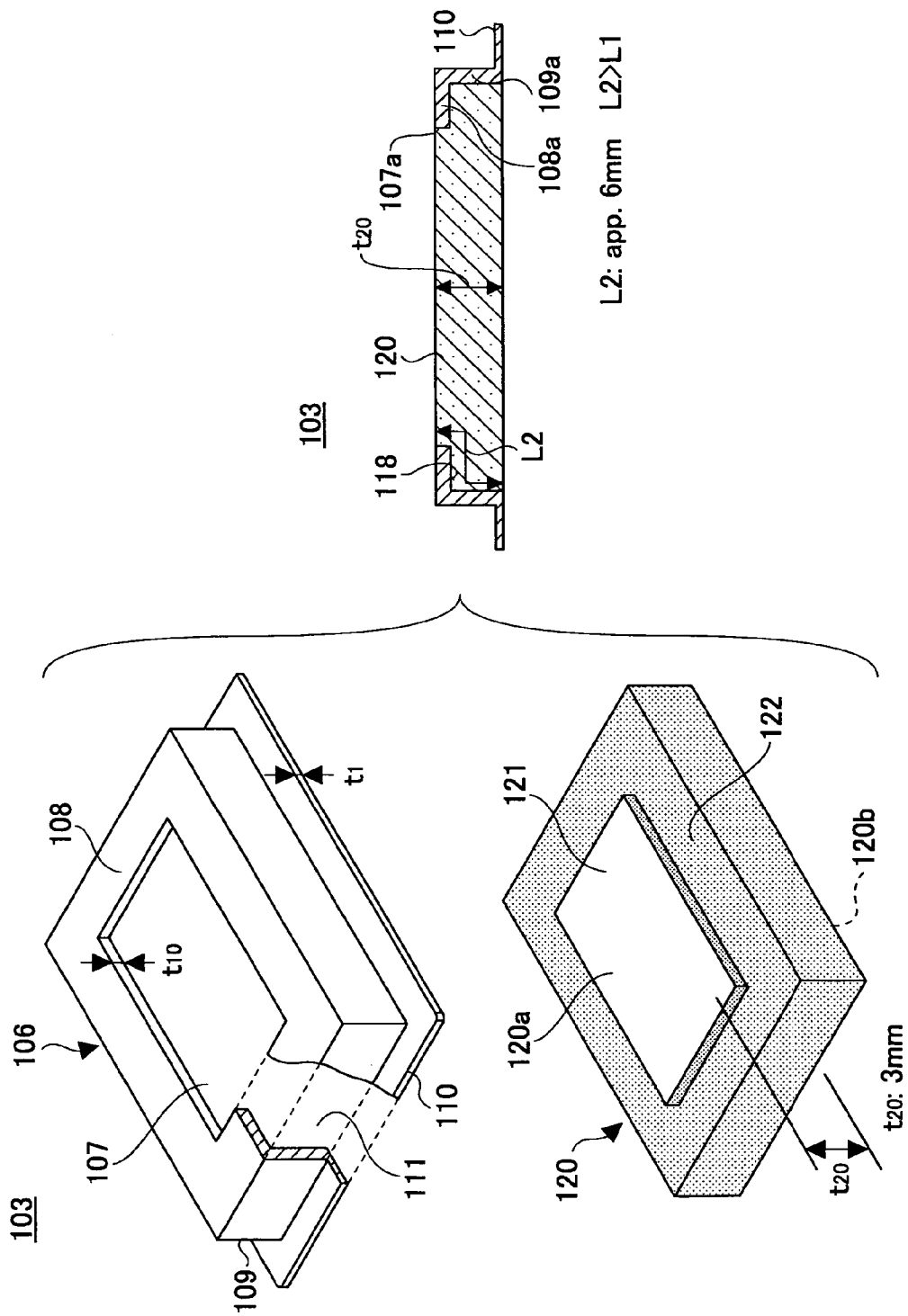
FIG. 5 is a diagram illustrating a window lid of the semiconductor-type projection device according to the embodiment of the present invention.

As illustrated in FIG. 5, the window lid 103 includes a Kovar frame member 106 shaped like a cap and a glass plate member 120.

Figure 6A:
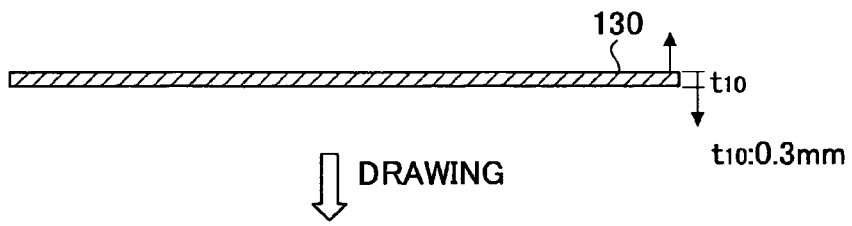
FIGS. 6A through 6F are diagrams for illustrating a process for manufacturing a frame member of the semiconductor-type projection device according to the embodiment of the present invention.
Figure 6B:

The frame member 106 is formed by processing a metal plate 130 having a thickness $t_{10}$ of 0.3 mm illustrated in FIG. 6A as a material. The frame member 106 includes a top plate part 108 having an opening window 107 in the center thereof, a peripheral side plate part 109, and the flange part 110. The peripheral side plate part 109 is connected to the entire peripheral edge part of the top plate part 108 so as to surround a space 111 under the top plate part 108. The flange part 110 extends outward from the entire lower peripheral edge of the peripheral side plate part 109. The frame member 106 includes the space 111 surrounded by the peripheral side plate part 109 under the top plate part 108. The flange part 110 has the same thickness $t_1$ of 0.25 mm as conventionally.

The glass plate member 120 has a thickness $t_{20}$ of 3 mm, and is sized so as to just fit the space 111. The glass plate member 120 includes a flat convex step part 121 on the upper surface thereof. The flat convex step part 121 is sized so as to correspond to the opening window 107, and projects from the upper surface of the glass plate member 120 by a dimension corresponding to the thickness $t_{10}$ of the top plate part 108. This flat convex step part 121 forms the window part 105.

The window lid 103 is formed by welding the glass plate member 120 inside the frame member 106 by matched welding, and then grinding an upper surface 120a and a lower surface 120b of the glass plate member 120. As a result, a matched welding part 118 is formed between the glass plate member 120 and the frame member 106 as illustrated in FIGS. 4A and 5.

As illustrated in FIG. 5, the glass plate member 120 is fitted into the space 111 from below the frame member 106, so that the convex step part 121 is fitted to the opening window 107. A lower surface (an internal surface) 108a of the top plate part 108, an internal surface 109a of the peripheral side plate part 109, and an internal surface 107a of the peripheral edge of the opening window 107 are welded by matched welding to a corresponding part 122 of the glass plate member 120, indicated by the dotted pattern in FIG. 5, so as to ensure air tightness. The matched welding part 118 is wide in area, so that the glass plate member 120 is joined to the frame member 106 with high strength. Further, a seal pass L2 (FIG. 5) is bent along the internal surface 109a of the peripheral side plate part 109, the lower surface 108a of the top plate part 108, and the internal surface 107a of the peripheral edge of the opening window 107 so as to be approximately 6 mm. That is, the seal pass L2 is approximately twice as long as the 3 mm seal pass L1 (FIG. 1A) of the window lid 13. Thus, the reliability of air tightness of the matched welding part 118 between the frame member 106 and the glass plate member 120 is higher than that of the matched welding part 18 of the window lid 13 illustrated in FIGS. 1A and 1B.

Further, with the window lid 103 being seam-welded onto the substrate 101, the matched welding part 118 is below the top plate part 108 of the frame member 106. As a result, fine air bubbles and cracks are hidden by the top plate part 108 so as to hardly appear in the window part 105. In the case of viewing mass-produced semiconductor-type projection devices 100 from above, the rate of appearance of fine air bubbles in the window part 105 is 0.1%, and the rate of appearance of fine cracks in the window part 105 is 0.2%, which are extremely low. Accordingly, in almost all the mass-produced semiconductor-type projection devices 100, not only light passing through the center part of the window part 105 but also light passing through the peripheral part of the window part 105 passes through the window part 105 without being affected by the fine air bubbles or cracks. Accordingly, the semiconductor-type projection device 100 has good characteristics without being affected by fine air bubbles or cracks.

FIGS. 6A through 6F are diagrams for illustrating a process for manufacturing the frame member 106. As illustrated in FIG. 6A, the frame member 106 employs a thin plate material 130 having the thickness $t_{00}$ of 0.3 mm, which is equal to the thickness $t_{00}$ of the top plate part 108, as its material. This thin plate material 130 is subjected to drawing so that a first-step frame member 106-1 illustrated in FIG.

Figure 6C:
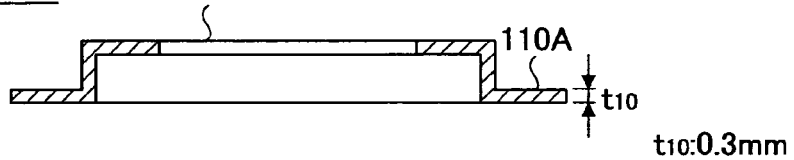
Figure 6D:
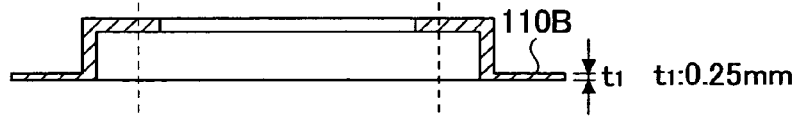

6B is formed. Then, primary window opening is performed by blanking so that a first-step opening window 107-1 is formed in the center of the top plate part of the first-step frame member 106-1 as illustrated in FIG. 6C. Then, stamping is performed on a first-step flange part 110A so as to press the first-step flange part 110A, so that a second-step flange part 110B illustrated in FIG. 6D is formed. Since the thickness of the first-step flange part 110A is $t_{10}$ (approximately 0.3 mm), the first-step flange part 110A is pressed by stamping only slightly in size. Accordingly, the stamping machine may be small in size. Further, the target thickness $t_1$ (0.25 mm) can be achieved only by stamping, and grinding after stamping is unnecessary.

Figure 6E:
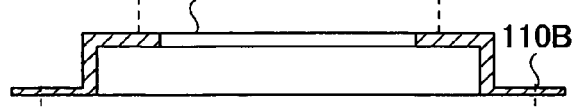
Figure 6F:
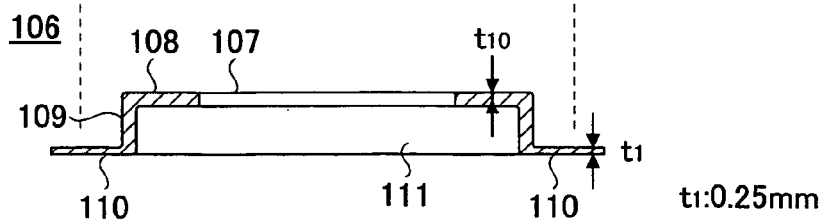

Next, as illustrated in FIG. 6E, secondary window opening for sizing is performed by press working so that the opening window 107 is formed. Finally, as illustrated in FIG. 6F, the peripheral part of the second-step flange part 110B is trimmed so that the flange part 110 is formed. As a result, the frame member 106 is manufactured.

The thin plate material 130 is reduced in material cost compared with the conventional thick plate material 20 illustrated in FIG. 2A. Further, since the thickness $t_{10}$ of the first-step flange part 110A is close to the target thickness $t_1$, the first-step flange part 110A is pressed by stamping only slightly in size. Accordingly, the stamping machine may be small in size. Further, a target thickness can be achieved by stamping only, and conventionally required grinding after stamping is unnecessary. Accordingly, the frame member 106 is lower in manufacturing cost than conventionally.

According to the present invention, instead of the DMD main body 102, an optical element such as LCOS (Liquid Crystal On Silicon: reflective liquid crystal), a CCD, or a CMOS may be mounted in the recess 101a of the substrate 101 with the window lid 103 being seam-welded onto the substrate 101.

According to the present invention, a matched welding part is positioned outside an opening window, and is hidden under the top plate part of a frame member. Accordingly, even when air bubbles or cracks are generated in the matched welding part, the air bubbles or cracks are prevented from appearing in the opening window. Accordingly, the air bubbles or cracks do not have an adverse effect on the optical characteristics of an optical semiconductor device. Accordingly, an optical semiconductor device free of the effect of air bubbles or cracks can be realized. Further, the appearance of the optical semiconductor device is not impaired.

Further, the frame member is formed by performing drawing on a metal plate having a thickness corresponding to that of the top plate part. Accordingly, the window lid is lower in manufacturing cost than conventionally, so that the optical semiconductor device, which is an end product, is lower in manufacturing cost than conventionally.

The present invention is not limited to the specifically disclosed embodiment, and variations and modifications may be made without departing from the scope of the present invention.

The present application is based on Japanese Priority Patent Application No. 2004-126746, filed on Apr. 22, 2004, the entire contents of which are hereby incorporated by reference.

What is claimed is:

1. An optical semiconductor device, comprising:

an optical element mounted on a substrate; and a window lid configured to seal the optical element in a space on the substrate, the window lid including a frame member and a single-piece glass plate member, the frame member being formed by performing drawing on a metal plate, wherein:

the frame member includes a top plate part having an opening window, a peripheral side plate part connected to a peripheral edge of the top plate part so as to surround a space on the top plate part, and a flange part extending outward from a peripheral edge of the peripheral side plate part on a side opposite from the top plate part, the flange part being fixed to the substrate; and the single-piece glass plate member has a convex shape and closes a space in the opening of the window of the top plate part and the space formed by the top plate part and the peripheral side plate part of the frame member, the glass plate member being welded by matched welding to a surface of the top plate part on a side toward the substrate and an internal surface of the peripheral side plate part.

2. The optical semiconductor device as claimed in claim 1, wherein:

a thickness of the flange part of the frame member is less than that of the top plate part, and is determined by stamping after the drawing.

3. The optical semiconductor device as claimed in claim 1, wherein:

the glass plate member is shaped so as to include a flat convex step part on a surface thereof on a side away from the substrate, the flat convex step part corresponding to the opening window; and the flat convex step part is fitted to the opening window so as to be disposed inside the opening window.

4. The optical semiconductor device as claimed in claim 1, wherein the optical element is a digital micromirror device.

* * * * *